United States Patent
Chien et al.

(10) Patent No.: US 7,501,908 B2
(45) Date of Patent: Mar. 10, 2009

(54) OSCILLATION CIRCUIT HAVING CURRENT SCALING RELATIONSHIP AND THE METHOD FOR USING THE SAME

(75) Inventors: Mao Chuan Chien, Hsinchu (TW); Yu Min Sun, Hsinchu (TW); Chu Yu Chu, Hsinchu (TW)

(73) Assignee: Advanced Analog Technology, Inc. (TW)

( * ) Notice: Subject to any disclaimer, the term of this patent is extended or adjusted under 35 U.S.C. 154(b) by 204 days.

(21) Appl. No.: 11/730,159

(22) Filed: Mar. 29, 2007

(65) Prior Publication Data
US 2008/0231386 A1 Sep. 25, 2008

(30) Foreign Application Priority Data
Mar. 7, 2007 (TW) .............................. 96107781 A

(51) Int. Cl.
*H03L 1/00* (2006.01)
(52) U.S. Cl. ....................................... 331/176; 331/185
(58) Field of Classification Search ................. 331/176, 331/185
See application file for complete search history.

(56) References Cited

U.S. PATENT DOCUMENTS 5,180,995 A * 1/1993 Hayashi et al. ................ 331/57
7,391,276 B2 * 6/2008 Sakaguchi ..................... 331/57

* cited by examiner

Primary Examiner—Joseph Chang
(74) Attorney, Agent, or Firm—Oliff & Berridge, PLC

(57) ABSTRACT

The oscillation circuit includes an output current mirror, a P-N complementary current mirror, a P-type current mirror and an N-type current mirror. The P-N complementary current mirror has the same structure as the output current mirror but has current that is only 1/k times the current of the output current mirror, wherein k is greater than 1. The P-type current mirror connects to the P-N complementary current mirror, and has current that is m times the current of the P-N complementary current mirror, where m is greater than 1. The N-type current mirror has one end connected to the P-type current mirror and another end connected to the output current mirror. The N-type current mirror has current that is n times the current of the P-type current mirror, where $$\frac{m \times n}{k} \geq 1,$$

and n is greater than 1.

9 Claims, 5 Drawing Sheets

OSCILLATION CIRCUIT HAVING CURRENT SCALING RELATIONSHIP AND THE METHOD FOR USING THE SAME

BACKGROUND OF THE INVENTION

1. Field of the Invention

The present invention relates to a high precision oscillation circuit, and more particularly, to a high precision oscillation circuit which can control the effect of temperature variation upon frequency within a specific range.

2. Description of the Related Art

FIG. 1 shows a corresponding diagram of frequency variation versus voltage gain for a piezoelectric device. The piezoelectric device is usually used in a backlight module of an LCD monitor, and therefore its operating frequency will affect the brightness of the LCD monitor. As far as the analog circuit controls the piezoelectric device, the magnitude of the output circuit will affect the operating frequency of the piezoelectric device. Therefore, finding a method to control the output current of the analog circuit in order to insulate it from temperature variation is an important topic.

FIG. 2 is a prior art oscillation circuit, which includes an oscillation current generating stage 22 and an output current mirror 21. Generally speaking, due to the distortion of the current mirror caused by inconsistent working points of P1, P2 and P3 transistors and the mismatch of N2 and N3 transistors, the frequency of prior art oscillation circuit has 10% error at process corner SS (−40° C.), and 7% error at process corner FF (90° C.). Besides, prior art oscillation circuits usually embed the resistor R1 and capacitor C1 inside the analog chip, which causes the operating frequency to become more susceptible to temperature and process variation.

As far as the backlight control ICs that exist in the market are concerned, users usually request the effect of temperature variation upon frequency to be limited to a range of ±2%, and therefore prior art circuits do not fulfill the requirements of the current design trend any more.

FIGS. 3(a) and 3(b) show another prior art circuit design, which replicates the structure of transistors N2 and N3 to form transistors N2a and N3a in order to inversely offset current and frequency variation of the transistors N2 and N3 caused by temperature variation. However, the circuit designs of FIGS. 3(a) and 3(b) waste too much chip area and thus do not satisfy efficient design methodology.

SUMMARY OF THE INVENTION

The oscillation circuit of the present invention uses less chip area but achieves the purpose of limiting the effect of temperature variation upon frequency to the range of ±2%. Besides, the oscillation circuit of the present invention selectively excludes the resistor $R_{EXT}$ and capacitor $C_{EXT}$ therein, and thus suffers less from the process variation.

The oscillation circuit according to an embodiment of the present invention includes an output current mirror, a P-N complementary current mirror, a P-type current mirror and an N-type current mirror. The P-N complementary current mirror has the same structure as the output current mirror but has current that is only 1/k times the current of the output current mirror, wherein k is greater than 1. The P-type current mirror connects to the P-N complementary current mirror, and has current that is m times the current of the P-N complementary current mirror, where m is greater than 1. The N-type current mirror has one end connected to the P-type current mirror and another end connected to the output current mirror. The N-type current mirror has current that is n times the current of the P-type current mirror, where $$\frac{m \times n}{k} \geq 1,$$

and n is greater than 1.

The method for using an oscillation circuit according to an embodiment of the present invention includes the step of generating a base current from a circuit having the same structure as the output current mirror but a smaller scale, where the base current is only 1/k times the current of the output current mirror, and k is greater than 1. Thereafter, the base current is amplified by m times and n times, wherein m and n are greater than 1. Finally, the result is sent to the output current mirror, wherein $$\frac{m \times n}{k} \geq 1.$$

BRIEF DESCRIPTION OF THE DRAWINGS

The invention will be described according to the appended drawings in which.

PREFERRED EMBODIMENT OF THE PRESENT INVENTION

Figure 1:
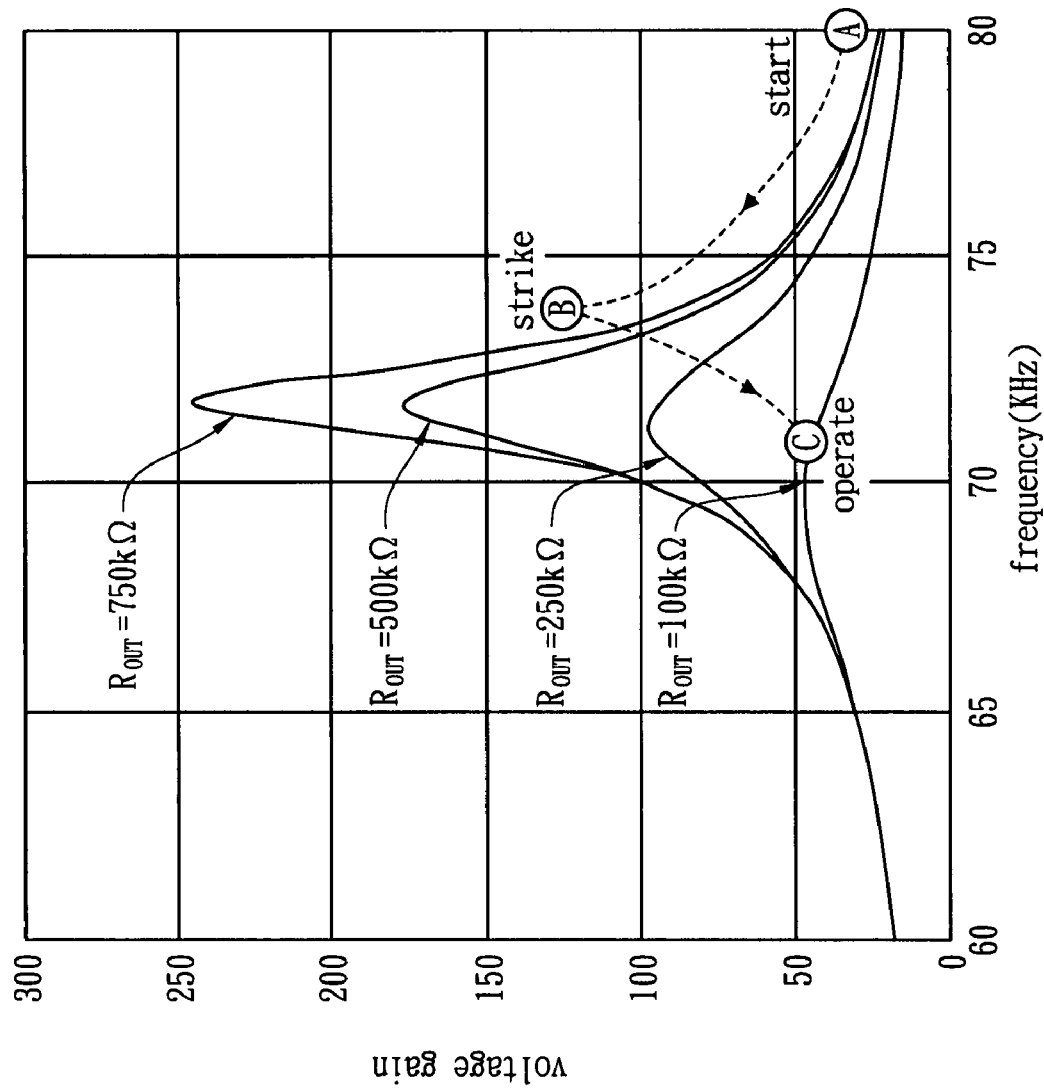
FIG. 1 shows a corresponding diagram of frequency variation versus voltage gain for a piezoelectric device.
Figure 2:
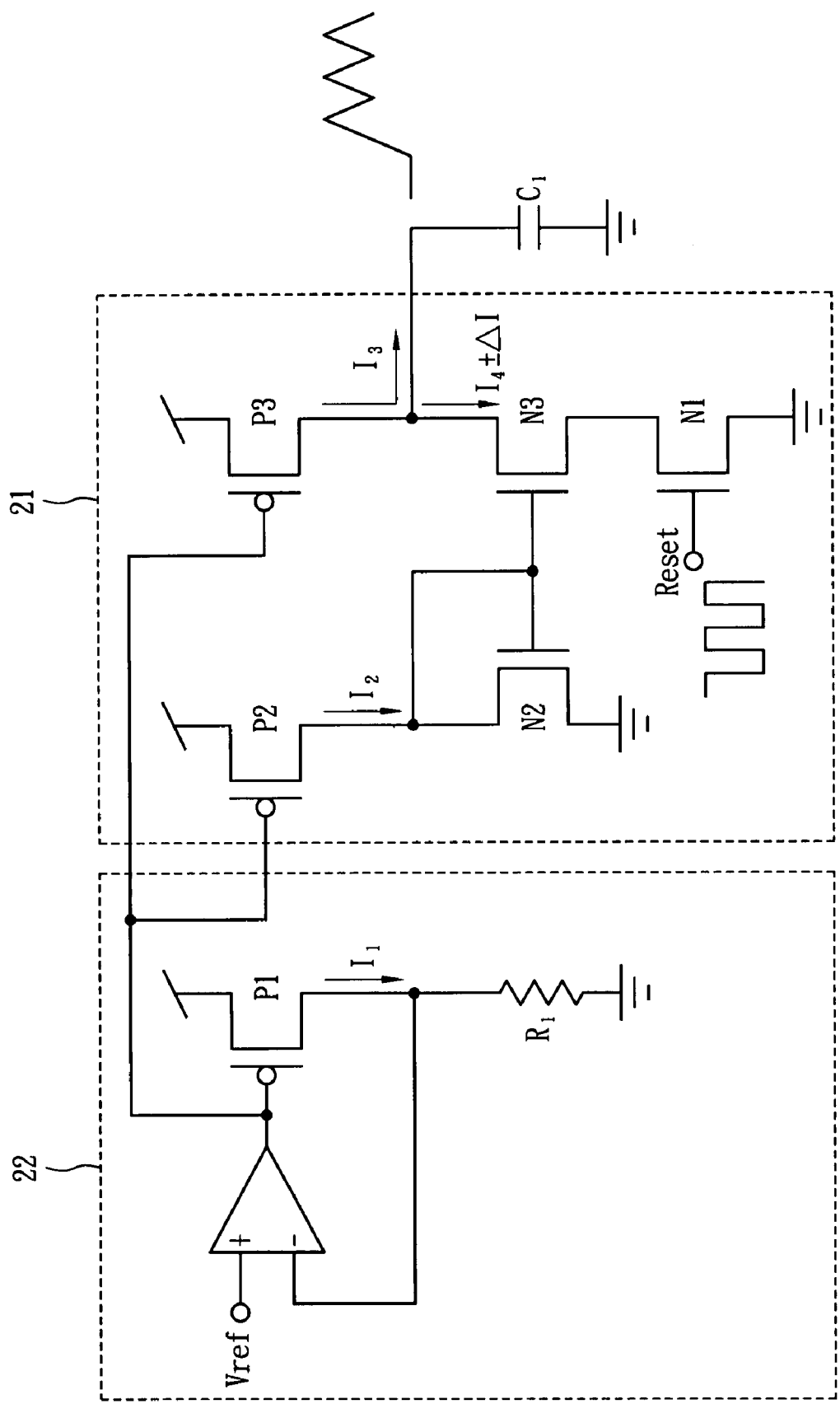
FIG. 2 is a prior art oscillation circuit.
Figure 3B:
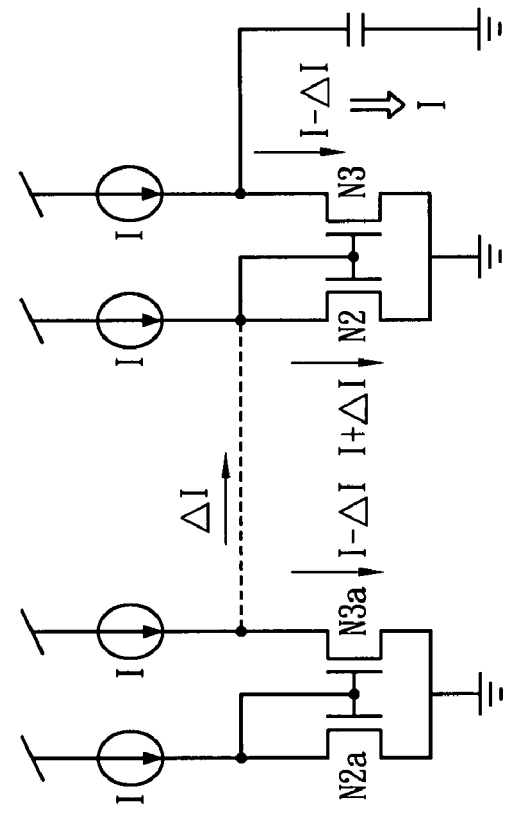
FIGS. 3(a) and 3(b) show another prior art oscillation circuit.
Figure 3A:
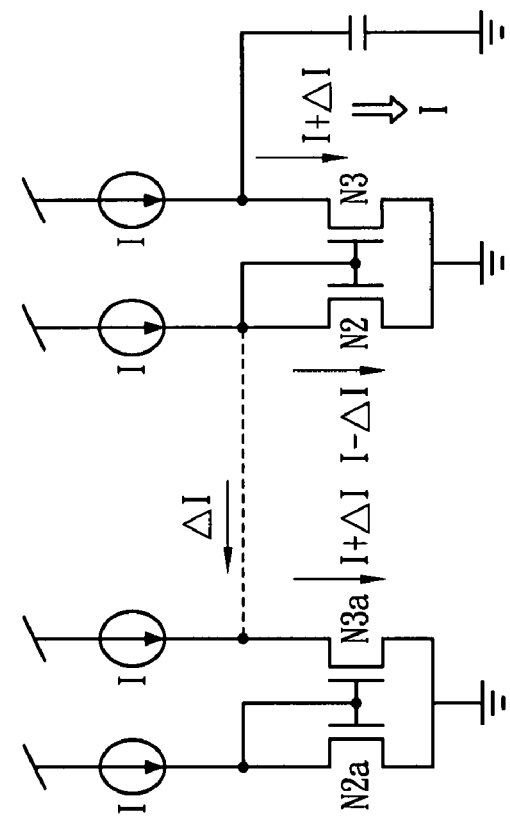
Figure 4:
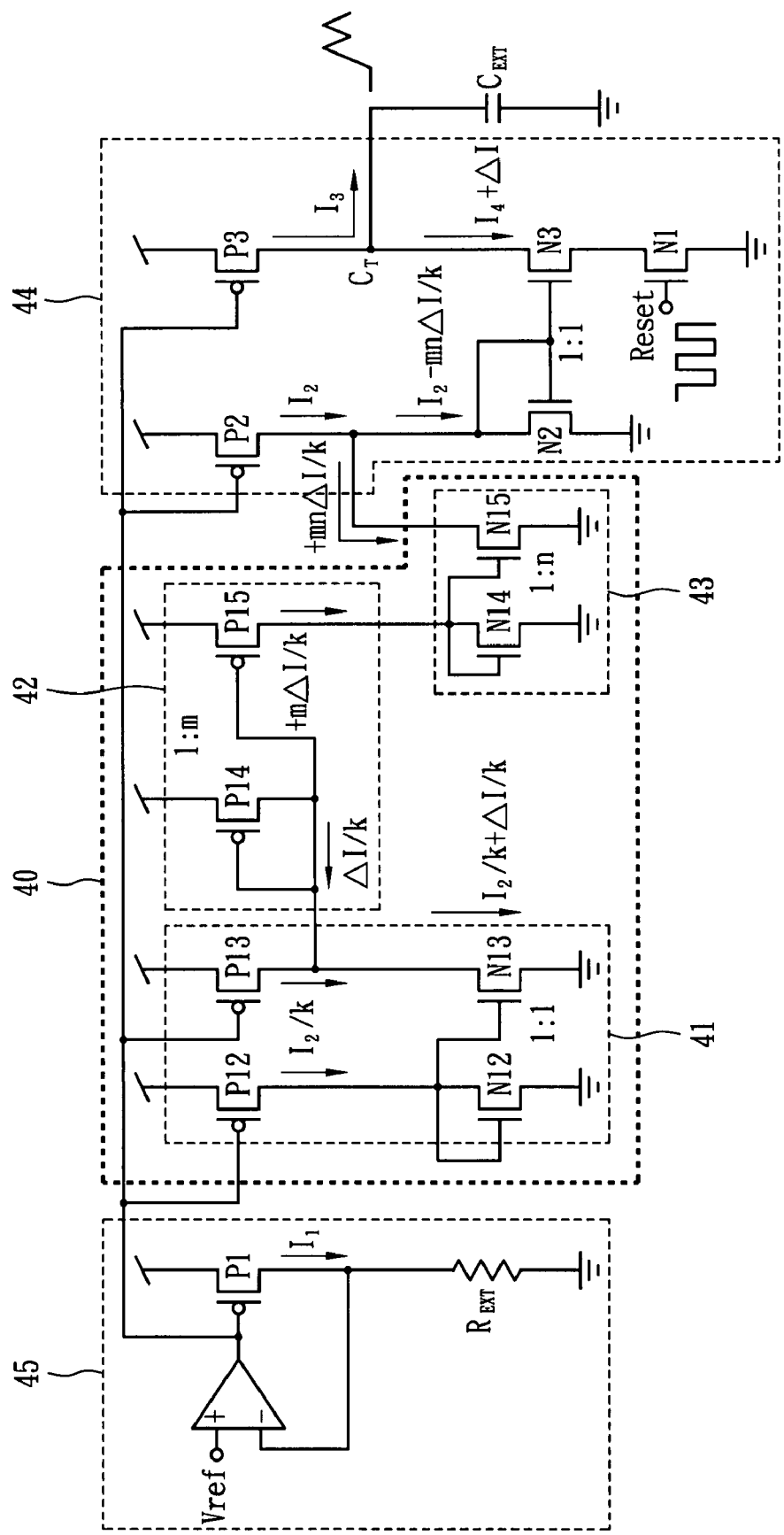
FIG. 4 shows an oscillation circuit according to an embodiment of the present invention.

FIG. 4 shows an oscillation circuit according to an embodiment of the present invention. The oscillation circuit includes a compensation current mirror 40 and an output current mirror 44, while the compensation current mirror 40 is located between the oscillation current generating stage 45 and the output current mirror 44. The compensation current mirror 40, which is for use in offsetting current variation of the output current mirror 44 caused by temperature variation, includes a P-N complementary current mirror 41, a P-type current mirror 42 and an N-type current mirror 43. The P-N complementary current mirror 41 has the same structure as the output current mirror 44, but is only 1/k times the scale of the output current mirror 44. Therefore, the current of the P-N complementary current mirror 41 is only 1/k times that of the output current mirror 44, where k is greater than 1. The P-type current mirror 42 connects to the P-N complementary current mirror 41, and because the transistor P14 has the same scale as the transistors P12 and P13, while the transistor P15 is m times the scale of the transistor P14, the current of the P-type current mirror 42 is m times that of the P-N complementary current mirror 41, where m is greater than 1. One end of the N-type current mirror 43 connects to the P-type current mirror 42, and another end connects to the output current mirror 44. The scale of the transistor N15 of the N-type current mirror 43 is n times that of the transistor N14, and therefore the current of the N-type current mirror 43 is n times that of the P-type current mirror 42, wherein n is greater than 1. The transistors P14 and P15 of the P-type current mirror 42 and the transistors N14 and N15 of the N-type current mirror 43 can be manufactured in a long channel device to avoid the short channel modulation effect. Considering the offset effect of the P-N complementary current mirror 41, the P-type current mirror 42 and the N-type current mirror 43, the current of the compensation current mirror 40 is $$\frac{m \times n}{k}$$

times that of the output current mirror 44. By means of the connection between the compensation current mirror 40 and the output current mirror 44, the current variation of the output current mirror 44 caused by temperature variation can be offset as $$\left(1 - \frac{m \times n}{k}\right) \times \Delta I.$$

Figure 5A:
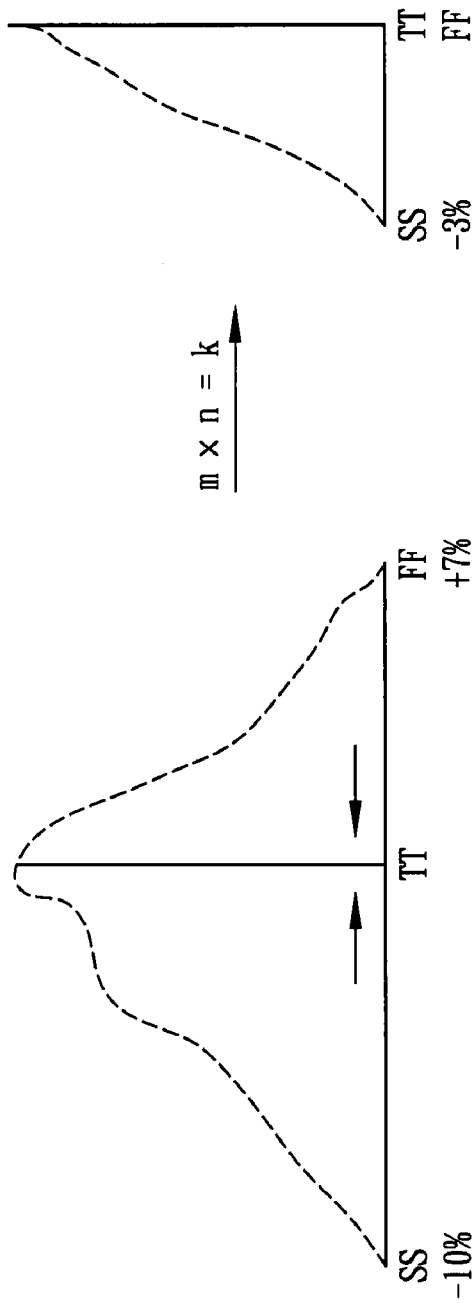
FIGS. 5(a) and 5(b) are methods of use of the oscillation circuit according to the present invention.

FIG. 5(a) is a method of use of the oscillation circuit according to the present invention. As far as the variation of the semiconductor process is concerned, if the process corner TT is set as a center, the temperature variation will make −10% frequency variation at corner SS, and make +7% frequency variation at corner FF. If $$\frac{m \times n}{k} = 1$$

is set, about +7% frequency variation at FF corner could be thereby offset, and only −3% frequency variation at SS corner would be left. In the meantime, the total error is only ±1.5%.

Figure 5B:
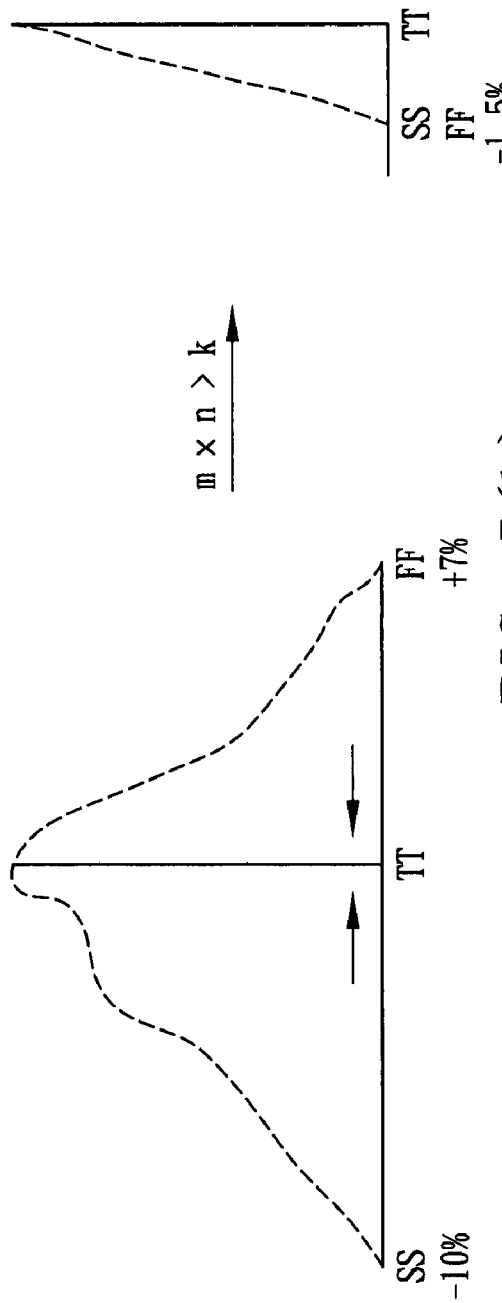

FIG. 5(b) is another method of use of the oscillation circuit according to the present invention. If $$\frac{m \times n}{k} > 1$$

is set, the best situation can be pursued. For example, if the condition of m=2, n=10 and k=5 is set, the frequency variation of the corners SS and FF can be further adjusted to −1.5%. In the meantime, the total error is only ±0.75%, which reduces the effect of the temperature variation upon frequency into one-fourth of the differences of the process variation between the corners SS and FF.

The oscillation circuit of the present invention could be manufactured in a single chip, which includes the output current mirror 44, the compensation current mirror 40 and the oscillation current generating stage 45, excluding the resistor $R_{EXT}$. Because the resistor $R_{EXT}$ and capacitor $C_{EXT}$ are exterior elements, the oscillation circuit of the present invention is less susceptible to the process variation. In addition, the oscillation circuit of the present invention uses less chip area than prior art circuits and still keeps the effect of temperature variation upon frequency within the range of ±2%.

The above-described embodiments of the present invention are intended to be illustrative only. Numerous alternative embodiments may be devised by persons skilled in the art without departing from the scope of the following claims.

What is claimed is:

1. An oscillation circuit comprising:
   an output current mirror;
   a P-N complementary current mirror having the same structure as the output current mirror but having current that is only 1/k times the current of the output current mirror, wherein k is greater than 1;
   a P-type current mirror connected to the P-N complementary current mirror, the P-type current mirror having current that is m times the current of the P-N complementary current mirror, wherein m is greater than 1; and
   an N-type current mirror having one end connected to the P-type current mirror and another end connected to the output current mirror, the N-type current mirror having current that is n times the current of the P-type current mirror, wherein $$\frac{m \times n}{k} \geq 1,$$

and n is greater than 1.

2. The oscillation circuit of claim 1, wherein the P-type current mirror and the N-type current mirror are manufactured in a long-channel device.

3. The oscillation circuit of claim 1, further comprising an oscillation current generating stage without an exterior resistor connected to the P-N complementary current mirror.

4. The oscillation circuit of claim 3, which is manufactured in a single chip, excluding an exterior capacitor therein.

5. The oscillation circuit of claim 1, wherein the effect of temperature variation upon frequency after adjustment of $$\frac{m \times n}{k} \geq 1$$

is limited to a range of ±2%.

6. A method for using an oscillation circuit, the oscillation circuit having an output current mirror as an output stage, the method comprising the steps of:
   generating a base current from a circuit having the same structure as the output current mirror but a smaller scale, wherein the base current is only 1/k times the current of the output current mirror, and k is greater than 1;
   amplifying the base current by m times, wherein m is greater than 1;
   reamplifying the base current by n times, wherein n is greater than 1; and
   outputting the result to the output current mirror, wherein $$\frac{m \times n}{k} \geq 1.$$

7. The method of claim 6, wherein the effect of temperature variation upon frequency after adjustment of $$\frac{m \times n}{k} \geq 1$$

is limited to a range of ±2%.

8. The method of claim 6, wherein the oscillation circuit is manufactured in a single chip, excluding an exterior capacitor and resistor therein.

9. The method of claim 7, wherein the effect of temperature variation upon frequency after adjustment of $$\frac{m \times n}{k} \geq 1$$

is limited to one-fourth of that of the process variation between SS corner and FF corner of the oscillation circuit.

* * * * *